United States Patent
Happ et al.

(10) Patent No.: US 8,742,387 B2
(45) Date of Patent: Jun. 3, 2014

(54) RESISTIVE MEMORY DEVICES WITH IMPROVED RESISTIVE CHANGING ELEMENTS

(75) Inventors: Thomas Happ, Dresden (DE); Franz Kreupl, Munich (DE); Jan Boris Philipp, Munich (DE); Petra Majewski, Munich (DE)

(73) Assignee: Qimonda AG, Munich (DE)

( * ) Notice: Subject to any disclaimer, the term of this patent is extended or adjusted under 35 U.S.C. 154(b) by 520 days.

(21) Appl. No.: 12/145,608

(22) Filed: Jun. 25, 2008

(65) Prior Publication Data

US 2009/0321706 A1 Dec. 31, 2009

(51) Int. Cl.
*H01L 47/00* (2006.01)
*H01L 45/00* (2006.01)

(52) U.S. Cl.
CPC ............ *H01L 45/06* (2013.01); *H01L 45/085* (2013.01); *H01L 45/1233* (2013.01); *H01L 45/1253* (2013.01); *H01L 45/141* (2013.01); *H01L 45/146* (2013.01)
USPC ................. 257/4; 257/E45.002; 257/E45.003

(58) Field of Classification Search
CPC ... H01L 45/06; H01L 45/085; H01L 45/1233; H01L 45/1253; H01L 45/141; H01L 45/146
USPC ........................ 257/2, 3, 4, E45.002, E45.003
See application file for complete search history.

(56) References Cited

U.S. PATENT DOCUMENTS

| | | | |
|---|---|---|---|
| 6,566,665 B2 * | 5/2003 | Baglin et al. ............... | 250/492.2 |
| 6,566,700 B2 | 5/2003 | Xu | |
| 6,809,362 B2 * | 10/2004 | Gilton ........................... | 257/296 |
| 6,965,137 B2 * | 11/2005 | Kinney et al. ................. | 257/295 |
| 7,052,588 B2 * | 5/2006 | Gu et al. ................... | 204/403.01 |
| 7,067,862 B2 * | 6/2006 | Rinerson et al. .............. | 257/295 |
| 7,151,273 B2 * | 12/2006 | Campbell et al. ................. | 257/3 |
| 7,354,793 B2 * | 4/2008 | Campbell ...................... | 438/102 |
| 7,470,533 B2 * | 12/2008 | Xu et al. .................... | 435/285.2 |
| 7,491,962 B2 * | 2/2009 | Liu et al. ............................ | 257/2 |
| 7,655,939 B2 * | 2/2010 | Ufert ................................. | 257/2 |
| 7,964,861 B2 * | 6/2011 | Ricker ............................... | 257/3 |
| 2004/0001374 A1 * | 1/2004 | Tanaka et al. ................. | 365/200 |
| 2004/0104129 A1 * | 6/2004 | Gu et al. ........................ | 205/775 |
| 2006/0131555 A1 * | 6/2006 | Liu et al. ........................... | 257/3 |
| 2006/0255329 A1 * | 11/2006 | Ufert ................................. | 257/5 |

(Continued)

OTHER PUBLICATIONS

Ahn et al., "Highly Reliable 50nm Contact Cell Technology for 256 Mb PRAM", Symposium on VLSI Technology Digest of Technical Papers, pp. 98-99, 2005.

(Continued)

*Primary Examiner* — Mary Wilczewski
(74) *Attorney, Agent, or Firm* — Edell, Shapiro & Finnan, LLC

(57) ABSTRACT

An integrated circuit includes a memory cell with a resistance changing memory element. The resistance changing memory element includes a first electrode, a second electrode, and a resistivity changing material disposed between the first and second electrodes, where the resistivity changing material is configured to change resistive states in response to application of a voltage or current to the first and second electrodes. In addition, at least one of the first electrode and the second electrode comprises an insulator material including a self-assembled electrically conductive element formed within the insulator material. The self-assembled electrically conductive element formed within the insulator material remains stable throughout the operation of switching the resistivity changing material to different resistive states.

20 Claims, 6 Drawing Sheets

(56) References Cited

U.S. PATENT DOCUMENTS

| | | | |
|---|---|---|---|
| 2007/0045604 A1* | 3/2007 | Liu et al. ............................ | 257/2 |
| 2007/0128792 A1* | 6/2007 | Gilton ............................ | 438/239 |
| 2008/0185574 A1* | 8/2008 | Campbell et al. ................. | 257/4 |
| 2008/0206920 A1* | 8/2008 | Campbell ..................... | 438/102 |
| 2008/0310211 A1* | 12/2008 | Toda et al. .................... | 365/148 |
| 2009/0124041 A1* | 5/2009 | Liu et al. ..................... | 438/102 |
| 2009/0321706 A1* | 12/2009 | Happ et al. ........................ | 257/4 |
| 2010/0171088 A1* | 7/2010 | Campbell et al. ................. | 257/2 |
| 2010/0184258 A1* | 7/2010 | Harshfield .................... | 438/128 |
| 2011/0240945 A1* | 10/2011 | Ricker ............................. | 257/2 |
| 2011/0278530 A1* | 11/2011 | Campbell ......................... | 257/3 |

OTHER PUBLICATIONS

Baek et al., "Highly Scalable Non-Volatile Resistive Memory Using Simple Binary Oxide Driven by Asymmetric Unipolar Voltage Pulses", IEDM Tech. Dig., pp. 587-590, Dec. 2004.

Choi et al.. "Resistive Switching Mechanism of TiO2 Thin Films Grown by Atomic-Layer Deposition", Journal of Applied Physics 98, 2005, 033715-1-10.

Gill et al., "Ovonic Unified Memory—A High-performance Non-volatile Memory Technology for Stand Alone Memory and Embedded Applications", Intel Corporation, Ovonyx Corp., Azalea Corp, Santa Clara, CA, ISSCC 2002, pp. 1-4.

Lai, Stefan, and Tyler Lowrey, "OUM—A 180 nm Nonvolatile Memory Cell Element Technology for Stand Alone and Embedded Applications", Intel Corporation, Santa Clara, CA., IEDM 2001, pp. 1-4.

Oh, et al. "Full Integration of Highly Manufacturable 512Mb PRAM Based on 90 nm Technology", Samsung Electronics Co., Ltd. Yongin, Korea, IEDM 2006, pp. 1-4.

Pirovano et al., "Scaling Analysis of Phase-Change Memory Technology, Electron Devices Meeting," 2003, IEDM '03 Technical Digest, IEEE International, pp. 29.6.1-29.6.4.

* cited by examiner

RESISTIVE MEMORY DEVICES WITH IMPROVED RESISTIVE CHANGING ELEMENTS

BACKGROUND

Many electronic devices and systems have the capability to store and retrieve information in a memory. A number of different memory families (e.g., DRAM, MRAM, pseudo-SRAM, NOR-flash, NAND-flash, etc.) are currently used for memory devices in such systems. Memory devices based on emerging technologies may be suitable as replacements for such current types of memory devices.

One type of memory that is suitable for use in electronic devices is resistive memory, which utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory, which utilizes a phase change material as the resistive memory element. The phase change material exhibits at least two different electrical states. The states of the phase change material are an amorphous state and a crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g., a face-centered cubic (FCC) state and a hexagonal closest packing (HCP) state, which can have different resistivities and may be used to store bits of data. As described herein, the amorphous state generally corresponds to a higher resistivity of the phase change material and the crystalline state generally refers to a lower resistivity of the phase change material (i.e., the phase change material has a higher resistivity in an amorphous state in comparison to a crystalline state of the phase change material).

Phase changes in the phase change materials may be induced reversibly, such that the memory changes from the amorphous state to the crystalline state and from the crystalline state to the amorphous state in response to heat pulses. The temperature changes of the phase change material may be achieved by driving current through a resistive heater proximate or adjacent the phase change material so as to provide ohmic heating to the phase change material. Controllable heating of the phase change material causes controllable phase change within the phase change material.

A phase change memory device can include a memory array having a plurality of memory cells that are made of phase change material and are programmable to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating. For example, a phase change material that is assignable to two different resistive states can be set from an amorphous state to a crystalline state by sending a current pulse through the phase change material so as to heat the phase change material above its crystallization temperature (lowering its resistance). To reset the phase change to its amorphous (higher resistance) state, a high current pulse with a short falling edge is applied to the phase change material, causing the phase change material to melt and become amorphous during subsequent quench cooling of the material.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

The trend to miniaturize semiconductor devices drives the technology development to smaller feature sizes and to shrinkage of critical dimensions. In addition, the high current density required to change the phase change material from a crystalline to an amorphous state (e.g., on the order of $10^7$ A/cm$^2$) typically requires phase-change memory structures to package the heater and sometimes the phase-change material itself in sublithographic dimensions (e.g., dimensions less than 100 nm, typically no greater than about 40 nm).

For example, a comparison of reset current vs. heater contact area for a Ge—Sb—Te (GST) phase change material layer is set forth in the plot of FIG. 7 (reprinted from A. Pirovano et al., *Scaling Analysis of Phase-Change Memory Technology*, Electron Devices Meeting, 2003, IEDM '03 Technical Digest, IEEE International, pages 29.6.1-29.6.4). In order to reduce the reset current to values of about 100 μA or less, the heater contact area should be no greater than about 250 nm$^2$ (with a cross section or diameter of the heater contact being no greater than about 18 nm).

The production of memory structures with portions having sublithographic dimensions can be complex and expensive.

It would be desirable to provide a resistive memory element (such as a phase change memory element) including an electrically conductive structure for the memory element having decreased dimensions and that is less complex and expensive to manufacture in comparison to conventional, sublithographic manufacturing techniques.

SUMMARY

An integrated circuit comprises a memory cell including a resistance changing memory element. The resistance changing memory element comprises a first electrode, a second electrode, and a resistivity changing material disposed between the first and second electrodes, where the resistivity changing material is configured to change resistive states in response to application of a voltage or current to the first and second electrodes. In addition, at least one of the first electrode and the second electrode comprises an insulator material including a self-assembled electrically conductive element formed within the insulator material. The self-assembled electrically conductive element formed within the insulator material has sublithographic dimensions and remains stable throughout the operation of switching the resistivity changing material to different resistive states.

The resistivity changing material can include, for example, a phase change material that changes resistivity in response to being heated between amorphous and crystalline states.

In an example embodiment, the insulator material comprises diamond-like carbon (or, alternatively, amorphous carbon), with a self-assembled electrically conductive carbon-in-carbon filament formed within the otherwise insulating carbon layer. In another embodiment, the insulator material comprises a transition metal oxide (TMO) material including at least one conductive contact or filament extending through the layer.

The self-assembled electrically conductive element is formed within the insulator material by electrically processing the insulator material after formation of the insulator material and without the requirement of forming vias within the insulator material and filling the vias with conductive material. This provides a conductive contact for the resistivity changing material having sublithographic dimensions and which is less complex and costly to produce in comparison to typical semiconductor structures formed with sublithographic dimensions.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "over", "under", etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various embodiments described herein may be combined with each other, unless specifically noted otherwise.

Figure 1:
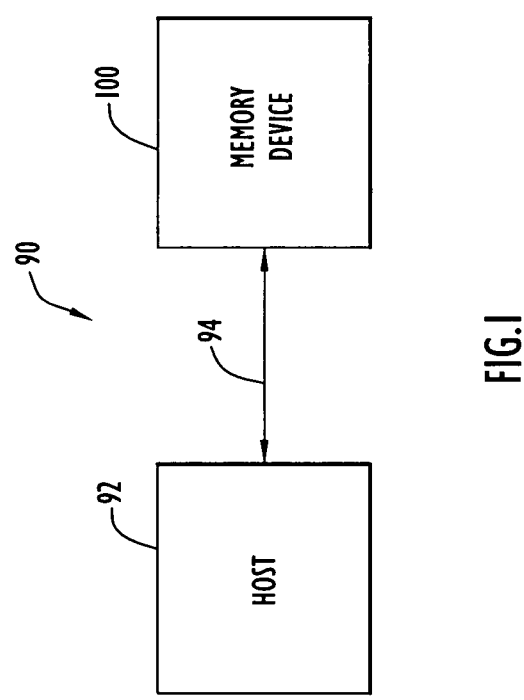
FIG. 1 is a block diagram illustrating an embodiment of a system including a memory device.

FIG. 1 is a block diagram illustrating an embodiment of a system 90 that includes a host 92 and a memory device 100. Host 92 is communicatively coupled to memory device 100 through communication link 94. Host 92 can be any of a wide variety of devices including but not limited to a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In another embodiment, memory device 100 includes a resistance changing memory device which can be or a phase change memory device or a magnetic memory device, for example.

Figure 2:
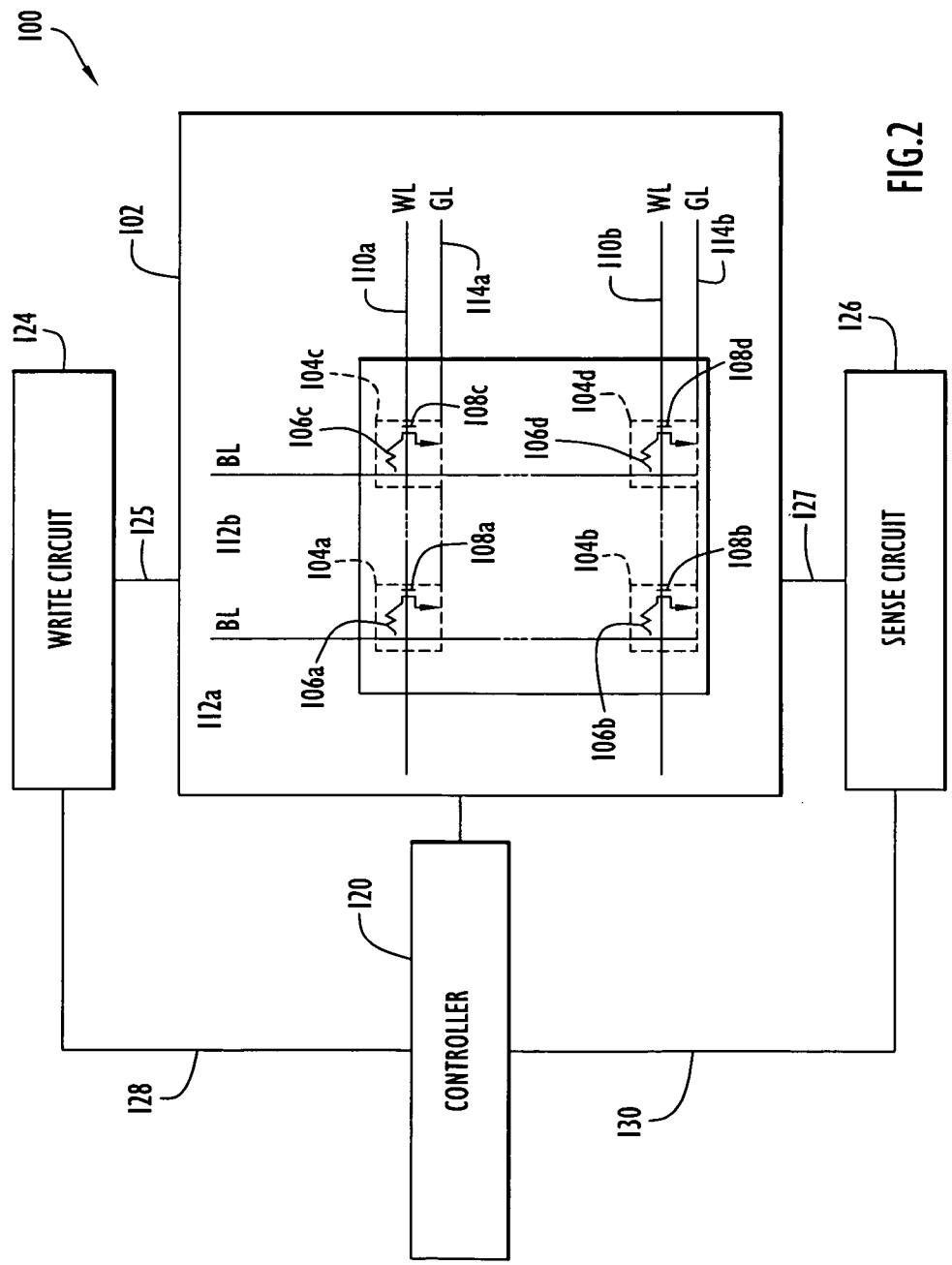
FIG. 2 is a diagram illustrating an embodiment of a memory device.

FIG. 2 is a diagram illustrating an embodiment of memory device 100. Memory device 100 includes a controller 120 and a memory array 102. Controller 120 may be located on a same memory chip as memory array 102 or may be external to a memory chip containing memory array 102. Memory array 102 includes a plurality of memory cells each of which is capable of being configured in at least two states which represent information (e.g., first logical state that represents a binary "1" and a second logical state that represents a binary "0").

As shown in FIG. 2, memory array 102 includes a plurality of resistance changing memory cells 104a-104d (collectively referred to as resistive memory cells 104), a plurality of bit lines (BLs) 112a-112b (collectively referred to as bit lines 112), a plurality of word lines (WLs) 110a-110b (collectively referred to as word lines 110), and a plurality of ground lines (GLs) 114a-114b (collectively referred to as ground lines 114). The ground lines are only a feature of a particular embodiment and are not required for the invention. In one embodiment, resistance changing memory cells 104 are phase change memory cells. In other embodiments, resistance changing memory cells 104 can be other suitable types of resistance changing memory cells, such as magnetic memory cells.

As used herein, the term "electrically coupled" is not meant to require that the elements must be directly coupled together and intervening elements may be provided between the "electrically coupled" elements. Each memory cell 104 is electrically coupled to a word line 110, a bit line 112, and a ground line 114. For example, memory cell 104a is electrically coupled to bit line 112a, word line 110a, and ground line 114a, and memory cell 104b is electrically coupled to bit line 112a, word line 110b, and ground line 114b. Memory cell 104c is electrically coupled to bit line 112b, word line 110a, and ground line 114a, and memory cell 104d is electrically coupled to bit line 112b, word line 110b, and ground line 114b.

Each memory cell 104 includes a resistance changing memory storage element 106 and a select device 108, e.g., a transistor or diode. For example, memory cell 104a includes a storage element 106a and select device 108a. One side of storage element 106a is electrically coupled to bit line 112a and the other side of storage element 106a is electrically coupled to one side of the source-drain path of select device 108a. The other side of the source-drain path of select device 108a is electrically coupled to ground line 114a. The gate of transistor 108a is electrically coupled to word line 110a. Memory cells 104b-104d include similarly arranged storage elements 106c-106d and select devices 108c-108d. While select device 108 is shown as a field-effect transistor (FET) in the illustrated embodiment, the select device 108 can be other suitable devices such as a bipolar transistor or a 3D transistor structure. In other embodiments, a diode-like structure may be used in place of a transistor. In this case, a diode and storage element 106 is coupled in series between each cross point of word lines 110 and bit lines 112.

In an embodiment, each resistance changing memory element 106 is a phase change memory element that comprises a phase change material that may be made up of a variety of materials, such as chalcogenide or chalcogenide free materials as described in further detail below. However, it will be appreciated that the invention is not limited to any particular material or classes of materials, and virtually any substance capable of being configured in two or more resistivity states can be employed.

Each phase change memory element may be changed from an amorphous state to a crystalline state or from a crystalline state to an amorphous state under the influence of temperature change. The amount of crystalline material coexisting with amorphous material in the phase change material of one of the phase change memory elements thereby defines two or more states for storing data within memory device 100. In the amorphous state, a phase change material exhibits significantly higher resistivity than in the crystalline state. Therefore, the two or more states of the phase change memory elements differ in their electrical resistivity. In an embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that are assigned multi-bit values, such as "00", "01", "10", and "11". In other embodiments, the two or more states are another suitable number of states in the phase change material of a phase change memory element.

Controller 120 includes a microprocessor, microcontroller, or other suitable logic circuitry for controlling the operation of memory device 100. Controller 120 controls read and write operations of memory device 100 including the application of control and data signals to memory array 102 through write circuit 124 and sense circuit 126. In an example embodiment, write circuit 124 provides voltage pulses through signal path 125 and bit lines 112 to memory cells 104 to program the memory cells. In another example embodiment, write circuit 124 provides current pulses through signal path 125 and bit lines 112 to memory cells 104 to program the memory cells.

Sense circuit 126 reads each of the two or more states of memory cells 104 through bit lines 112 and signal path 127. In an example embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another example embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

Write circuit 124 provides suitable programming pulses to program the resistance changing memory cells 104 to the desired state. An example of setting the resistivity of a phase change random access memory (PCRAM) is described below. However, as previously noted, the memory device can be utilized with other types of resistance changing memory cells (e.g., MRAM cells).

During a "set" operation of a phase change memory cell 104, the phase change memory element 106 is electrically processed where a set current or voltage pulse is selectively enabled by write circuit 124 and sent through the corresponding bit line 112 to phase change memory element 106, thereby heating phase change memory element 106 above its crystallization temperature (but typically below its melting temperature). In this way, phase change memory element 106 reaches its crystalline state or a partially crystalline and partially amorphous state during this set operation.

During a "reset" operation of phase change memory cell 104, the phase change memory element 106 is electrically processed, where a reset current or voltage pulse is selectively enabled by write circuit 124 and sent through corresponding bit line 112 to phase change memory element 106. The reset current or voltage quickly heats phase change memory element 106 above its melting temperature. After the current or voltage pulse is turned off, phase change memory element 106 quickly quench cools into the amorphous state or a partially amorphous and partially crystalline state.

Figure 3:
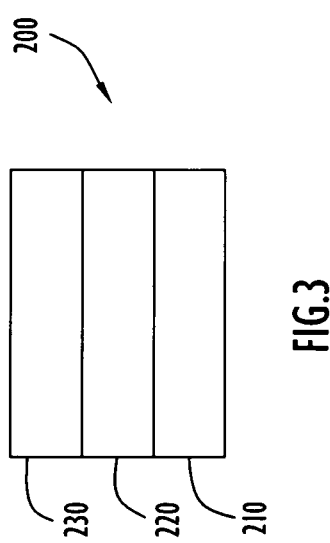
FIG. 3 is a schematic cross-sectional view of an embodiment of a phase change memory element.

FIG. 3 illustrates a cross-sectional schematic view of an embodiment of a phase change memory element 200, which includes a first or bottom electrode layer 210, a phase change material layer 220 and a second or top electrode layer 230. Some or all of the portions of the phase change memory element can be formed on or within portions of a substrate (not shown), where the substrate comprises silicon (Si).

The top and bottom electrodes of the phase change memory element can be connected in a conventional or other suitable manner via suitable conductive contacts or connecting elements to an electrical source which applies a voltage or current to the memory element to facilitate heating and phase changes within the phase change material layer. For example, the phase change memory element 200 may be configured to form a phase change memory element 106 as shown in FIG. 2, in which one of the bottom and top electrode layers 210, 230 of memory element 200 is electrically coupled to a corresponding bit line 112 and the other of the bottom and top electrode layers 210, 230 of memory element 200 is electrically coupled to one side of the source-drain path of a corresponding select device 108.

Each of the layers of the memory element can be formed from one or more suitable deposition processes including, without limitation, chemical vapor deposition (CVD), metal organic chemical vapor deposition (MOCVD), plasma enhanced chemical vapor deposition (PECVD), high density plasma-chemical vapor deposition (HDP-CVD), atomic layer deposition (ALD), physical vapor deposition (PVD), jet vapor deposition (JVD), or any other suitable deposition technique.

The top electrode layer 230 is formed of an electrically conductive material comprising any one or combination of suitably conductive elements including, without limitation, titanium (Ti), titanium nitride (TiN), tungsten (W), tungsten nitride (WN), tungsten carbide (WC), aluminum (Al), tantalum (Ta), tantalum nitride (TaN), tantalum carbide (TaC), C, Ru, Pt, Ir, and combinations thereof.

The phase change material layer 220 can be formed of any suitable material that can be heated to at least two different phase states (amorphous and crystalline) having different resistivities as noted above. Chalcogenide alloys that contain one or more elements from Group VI of the periodic table are useful as such materials. For example, the phase change material can be comprised of a chalcogenide compound or alloy material, such as Ge—Sb—Te (GST), Ge—Bi—Te, Bi—Te, Sb—Te, Ge—Te, or Ag—In—Sb—Te. In one embodiment, the phase change material is chalcogen free, such as Ge—Sb, Ga—Sb, In—Sb, or Ge—Ga—In—Sb. In other embodiments, the phase change material can be made up of any suitable material including one or more of the elements Ge, Sb, Te, Ga, Ag, In, Se, and S. As noted above, ohmic or resistive heating of the phase change material can be applied (i.e., by application of a voltage or current to electrode layers 210, 230) to achieve a phase change between amorphous and crystalline states of a portion of the phase change material layer 220, which results in a different resistive state of the phase change material.

Figure 4:
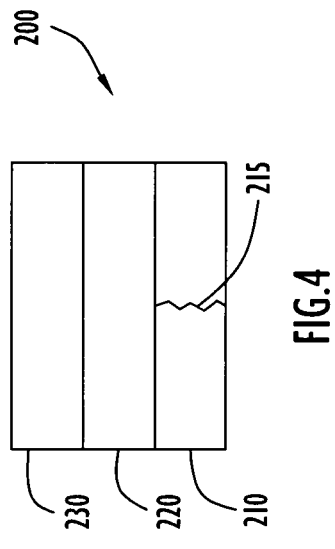
FIG. 4 is a schematic cross-sectional view of the phase change memory element with a self-assembled electrically conductive contact extending through the bottom electrode layer.

The bottom electrode layer 210 comprises a suitable insulator material having high resistance or electrical insulating properties. The insulator material forming the bottom electrode layer also includes suitable physical properties that facilitate the formation of an electrical contact extending through the layer to render the insulator material useful as an electrically conductive contact or electrode for heating the phase change material. In particular, the electrode layer 210 is electrically processed such that a self-assembled electrical element or contact, for example, in the form of a filament 215, is formed which extends between top and bottom or opposing surfaces of layer 210 (as shown in FIG. 4).

The bottom electrode layer is initially formed by depositing the insulator material layer, where the insulator material layer does not include the electrical contact or filament (as shown in FIG. 3). Formation of an electrical contact or filament 215 within insulator layer 210 (as shown in FIG. 4) is achieved by application of a controlled voltage or current to the layer during or after formation of the entire memory element as described below. Thus, a self-assembled electrical contact or filament having sublithographic dimensions (i.e., dimensions no greater than about 40 nm) can be provided within the layer of insulator material by electrically controlled formation of the electrical contact instead of using conventional etching or other techniques to form an electrically conductive contact through the layer (e.g., where a via is formed within the layer and then filled with a conductive material).

The insulator material is selected such that it is formed in the bottom layer with a high resistive or insulating state and, upon application of a suitable voltage or "set" current, a conductive element or contact is formed through the layer such that the layer effectively has a reduced or lower resistive state. Upon application of a higher "reset" current, the layer is changed or switched back to its high resistive or insulating state. An important feature of the insulator material forming the bottom electrode layer is that the current density and reset current required to switch the insulator material from its low resistance state (in which an electrically conductive contact exists and extends through the layer) to its high resistance state is much greater than the current density and reset current required to switch the phase change material from a crystalline state to an amorphous state. This renders the bottom electrode layer effective as a conductive layer during the entire operation of the phase change memory device (in which the phase change material is switched between amorphous and crystalline states).

In an embodiment, the bottom electrode layer is formed with an insulating amorphous carbon material or diamond-like carbon material using a suitable deposition process (e.g., PECVD, CVD, sputtering or laser ablation), and the deposited layer is subsequently electrically processed under controlled voltage and current conditions so as to form an electrically conductive element or contact in the form of a filament extending through a portion of the diamond-like carbon layer. In particular, the bottom electrode layer is formed from a diamond-like carbon (DLC) material, a majority or substantial portion of which contains sp3 hybridized carbon atoms prior to electrical processing of the DLC layer to make the layer conductive.

The formation of a DLC layer as a hard mask is well known in conventional semiconductor production processes. For example, utilizing conventional DLC mask deposition techniques, a DLC layer can be deposited on a substrate at a rate of about 500 nm/minute at an operational temperature of about 400° C. and utilizing suitable precursor compounds. However, it can be readily appreciated that certain variables, such as the temperature deposition rate and the composition of precursor gaseous components, can be modified as necessary in the CVD process to achieve the desired deposition rate such that a DLC layer can be formed having a thickness in the desired range.

In particular, a DLC layer for use as an electrode layer for the phase change memory element can be formed in the range of about 40 nm or less, about 30 nm or less, or even about 20 nm or less (e.g., a thickness of about 5 nm to about 15 nm) using conventional PECVD equipment for a semiconductor manufacturing process.

The DLC layer can be undoped or, alternatively, can include any one or more suitable dopants including, without limitation, nitrogen, boron, arsenic, phosphorous, antimony, and hydrogen. The dopants can be provided within the DLC layer utilizing any conventional and/or other processes including, without limitation, ion implanting and/or surface diffusion techniques. In an example embodiment, one or more dopants are introduced into the DLC by a co-flow of appropriate gases ($N_2$, $BCl_3$, $NH_4$, $PH_3$, $AsH_3$, $SbH_3$) during a PECVD process.

Electrically controlled self-assembly of an electrically conducting filament through the DLC layer can be achieved by application of a suitable forming voltage and set current to the DLC layer, where the thickness of the deposited DLC layer can be set to control the voltage necessary to form the conducting carbon element within the insulating carbon layer. For DLC material, an electric field strength of about 0.2 V/nm must be applied across the layer in order to achieve electrical breakdown or change in resistance of the DLC layer so as to form the conducting contact or filament through the layer. For a DLC layer having a thickness of about 5 nm to about 20 nm, the DLC layer can be effectively switched from a high resistive or electrically insulating state to a lower resistive state including an electrically conductive carbon filament extending through the insulating carbon layer by applying a voltage to the layer in the range of about 1-4 V. Typical operating ranges for a semiconductor chip are in the range of about 2-4 V (with some higher operating ranges being about 5-6 V). Therefore, utilizing the standard operating voltages that are available for the semiconductor chip, an electrically conductive filament can be formed through a DLC layer disposed on a semiconductor chip when the DLC layer has a thickness no greater than about 20 nm (or no greater than about 30 nm for higher operating voltages extending up to 6 V).

During "switching" of the DLC layer from an insulating state to a conductive state by application of a suitable forming voltage and set current, some of the sp3 hybridized carbon atoms are changed to $sp^2$ hybridized carbon atoms, resulting in the formation of an electrically conductive contact or bridging element through the layer. This conductive contact is in the form of a carbon-in-carbon filament extending between the top and bottom (or opposing) surfaces of the layer. The electrically conductive carbon filament is self-assembled through the otherwise insulating carbon layer due to electrical processing of the DLC layer and with no formation of vias and filling of conductive material within this layer.

The formation of a self-assembled electrically conductive filament in a DLC layer was demonstrated in both an N-doped DLC layer and an undoped DLC layer. The nitrogen-doped DLC layer was formed by adding a $N_2$-gas flow in a PECVD process so as to achieve doping in the range of about 1-2% by weight within the DLC layer. Each DLC layer had a thickness of about 8 nm. The voltage and current applied to each DLC layer, which resulted in the formation of an electrically conductive filament within the DLC layer, is shown in the voltage vs. current plots of FIGS. 8 and 9.

Figure 8:
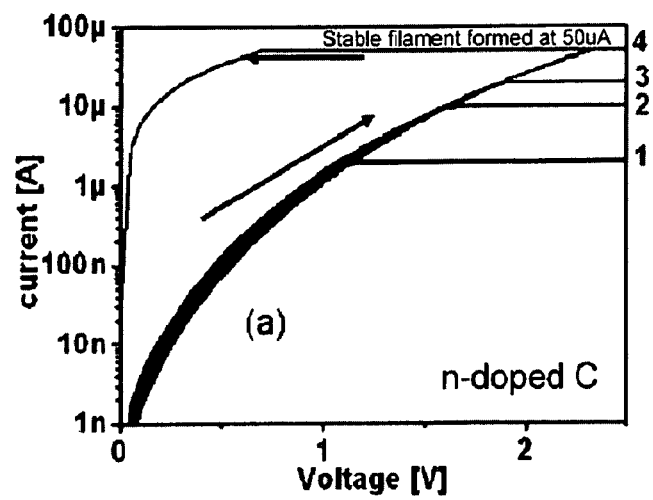
FIG. 8 is a plot of voltage vs. current demonstrating the formation of a conductive filament in an n-doped diamond-like carbon layer.

For the n-doped DLC layer, the current applied to the layer was raised in four steps from about 2 μA to about 50 μA (indicated by numbers 1-4 in the plot of FIG. 8). Carbon switching is initiated within the n-doped DLC layer between about 20 μA to about 50 μA at a forming voltage of about 2 V, with the power required to switch or conductively turn "on" the DLC layer being about 50 μW. As can be seen from the plot of FIG. 8, the formation of a stable conductive carbon-in-carbon filament was demonstrated in the n-doped DLC layer at a set current of 50 μA, where it can be seen that the current remains relatively constant at different applied voltages.

Figure 9:
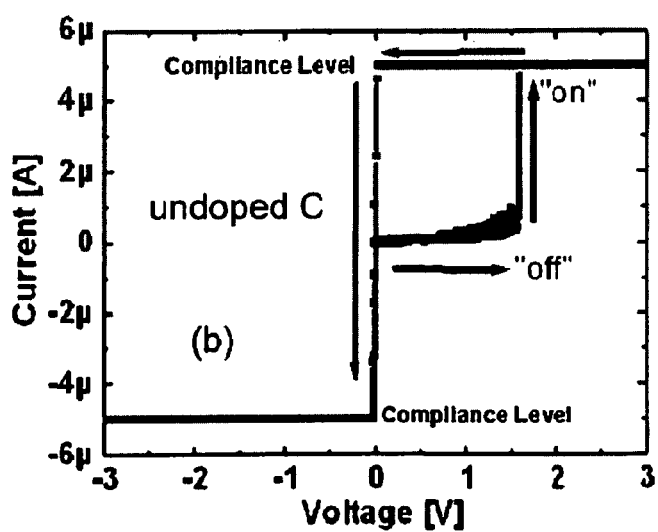
FIG. 9 is a plot of voltage vs. current demonstrating the formation of a conductive filament in an undoped diamond-like carbon layer.
Figure 10:
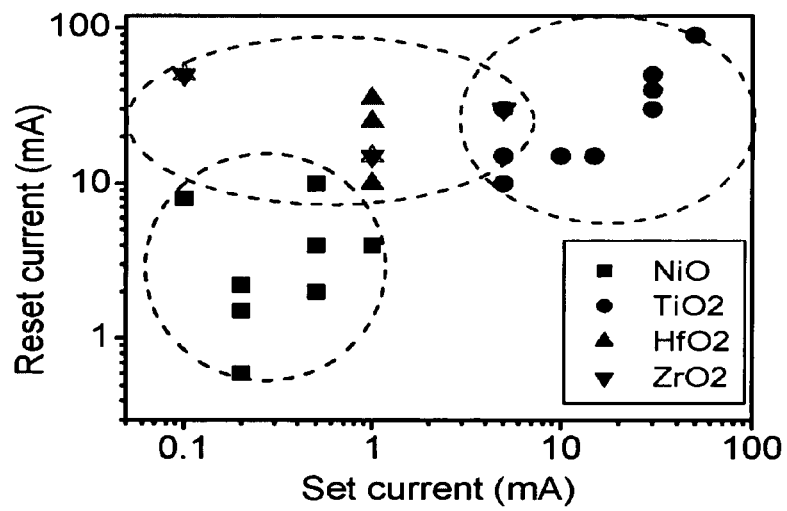
FIG. 10 is a plot of set current vs. reset current for different transition metal oxide materials.

As can be seen from FIG. 9, carbon switching and the formation of an electrically conductive filament occurs within the undoped DLC layer with the application of a forming voltage of about 1.5 V.

The carbon "switching" in the DLC layer can be reversible, where the layer with conductive filament structure can be switched back to the insulating structure upon application of a sufficiently high and sufficiently short reset current, where the current density within the DLC layer is on the order of about $10^9$ A/cm$^2$. At this high current density, the electrically conductive element breaks down and $sp^2$ hybridized carbon atoms are converted back to $sp^3$ hybridized carbon atoms. However, since current densities required to switch the phase change material in a phase change memory element between crystalline and amorphous states are typically on the order of about $10^7$ A/cm2, the conductive filament formed in the DLC layer is stable during normal operation of the phase change memory device.

It has further been demonstrated that conducting filaments can be formed in DLC layers having cross-sectional dimensions (e.g., diameters) in the range of about 20 nm or less, typically on the order of about 1 nm to about 15 nm. This results in a sufficiently small heater contact area for the phase change material, which further reduces that reset current value required to switch the phase change material from a crystalline to an amorphous state within the phase change memory element.

Thus, an amorphous carbon layer such as a DLC carbon layer can be processed in the manner described above to form a self-assembled carbon-in-carbon electrode for a phase change memory element, in which an electrically conductive carbon filament is isolated within and extends through an electrically insulating carbon layer. The electrically conductive filament is formed through the amorphous carbon layer having sublithographic dimensions (e.g., transverse cross-sectional dimensions of less than about 10 nm) without the requirement of forming vias through the insulating carbon layer and filling such vias with conductive material.

In another embodiment, the electrode layer can comprise a metal oxide material, such as a transition metal oxide (TMO) material, that has been electrically processed under controlled voltage and current conditions so as to form an electrically conductive contact extending through a portion of the layer. The TMO layer can be deposited by CVD, ALD or any other suitable deposition process. Similar to the DLC layer described above, the transition metal oxide layer can also be switched from a high resistance or electrically insulating state to a low resistance or electrically conductive state by application of a suitable forming voltage and current to the layer after formation of the layer during manufacture of the memory element. The TMO oxide layer can also be switched from the low resistance or electrically conductive state to its high resistance or electrically insulating state upon application of a sufficiently high reset current to the layer.

Examples of suitable TMO materials that can be used to form the layer include, without limitation, nickel oxide (NiO), titanium oxide ($TiO_2$), hafnium oxide ($HfO_2$), and zirconium oxide ($ZrO_2$), as well as doped compounds (e.g., titanium doped nickel oxide). The formation of a TMO layer comprising at least one of nickel (Ni), titanium (Ti), strontium (Sr), hafnium (Hf) and zirconium (Zr) can be used to form the bottom electrode layer.

A conductive contact or path is formed in the transition metal oxide layer upon application of a suitable forming voltage and current to the layer, which forms a conductive filament in the insulating transition metal oxide (TMO) matrix, and hence changes the TMO layer from a high resistive or insulating state to a low resistive or conductive state. The conductive contact or path that is formed within the insulating transition metal oxide layer can be in the form of at least one conductive filament that extends through the metal oxide layer. It has further been demonstrated that the cross-sectional dimension (e.g., diameter) of a single conductive filament formed through a transition metal oxide layer (i.e., extending between top and bottom or opposing surfaces of the layer) can be about 15 nm or less. Thus, a self-assembled conductive contact or filament having sublithographic dimensions is formed within the metal oxide layer solely by electrical processing of the layer (and without forming and filling vias with conductive material within the otherwise insulating layer).

The forming voltage and current to be applied to the TMO layer so as to achieve a low resistive state (in which an electrically conductive contact or filament extends through the layer) will depend upon a number of variables, including the selection of a particular transition metal, oxidation level of the transition metal within the TMO layer, and the thickness of the TMO layer. Generally, an increase in oxidation level of the transition metal (for example an increase in x ($x \leq 1$) for the transition metal oxide NiOx) within the layer will result in an increase in the reset current in which the layer is converted back to its high resistive state.

A number of set and reset current values required for different TMO materials at various conditions are plotted in FIG.

Figure 11:
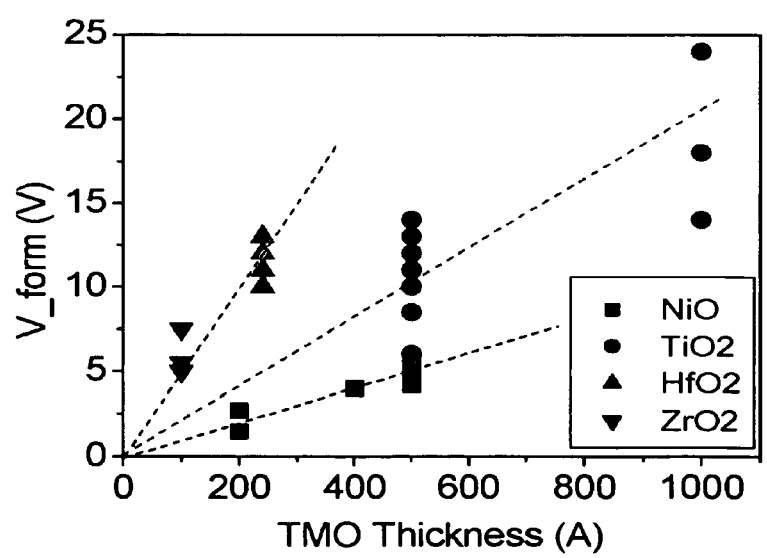
FIG. 11 is a plot of TMO layer thickness vs. forming voltage for different transition metal oxide materials.

10, and plots of the forming voltage (voltage required to form the conductive contact through the layer) vs. TMO layer thickness for different TMO materials are provided in FIG. 11 (reprinted from I. G. Baek et al., *Highly Scalable Non-Volatile Resistive Memory Using Simple Binary Oxide Driven by Asymmetric Unipolar Voltage Pulses, IEDM Tech. Dig.*, pages 587-59, December 2004). As can be seen by data in these plots, the properties of the TMO layer can be adjusted by material engineering, for example the reset current can be varied over more than two orders of magnitude.

The forming voltage can also be reduced to 2-6 V or less (normal operating ranges for semiconductor chips), depending upon the type and thickness of TMO material selected.

Depending upon the type of transition metal oxide (TMO) material selected, the oxidation level of the material within the layer, and the layer thickness, the TMO layer can be configured to have a reset current that is much greater than the reset current required for the phase change material. For example, a TMO material and layer thickness can be selected such that the reset current for the TMO material is at least about 5 mA.

Figure 7:
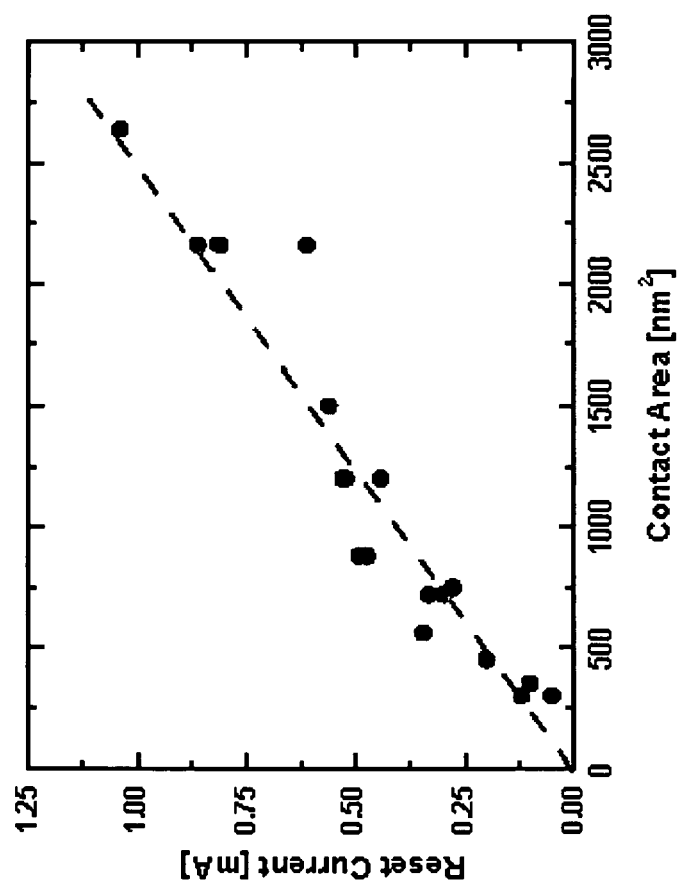
FIG. 7 is a plot of reset current vs. contact area for a Ge—Sb—Te phase change material.

Referring to FIG. 7, the reset current required for a GST layer having a contact area that corresponds with a 15 nm conductive contact is about 91 µA, which is much smaller than the 5 mA reset current for the TMO material layer with such conductive contact. Thus, a TMO material layer can be provided as an electrode layer for the phase change memory element, where the TMO material layer includes an electrical contact or filament extending through the layer and having a transverse cross-sectional dimension (e.g., diameter) of about 15 nm or less such that the conductive TMO electrode layer is stable throughout the operation of the phase change memory element.

Formation of a memory element is now described, in which the memory element includes an insulating material having suitable physical properties (e.g., an amorphous carbon material or a metal oxide material) so as to facilitate switching of the insulating material from a high resistive or insulating state to a lower resistive or conducting state. The insulating material is deposited using any suitable deposition technique (e.g., CVD or ALD) to form layer 210 having a suitable thickness, preferably no greater than about 20 nm (e.g., about 5 nm to about 15 nm).

A phase change material layer 220 is formed over layer 210 by depositing a suitable phase change material, such as any of the types described above (e.g., GST) on layer 210 using any suitable deposition technique (e.g., CVD, HDP-CVD, ALD, MOCVD, PVD, JVD) resulting in a thickness in the range from about 3 nm to about 150 nm. A suitable conductive material (e.g., comprising any one or more of Au, Ti, W, Cu, Al, and Ta) is then deposited over the phase change material layer using any suitable deposition technique (e.g., CVD, HDP-CVD, ALD, MOCVD, PVD, JVD) so as to form the top electrode layer 230 with a thickness in the range from about 5 nm to about 150 nm.

As noted above, conductive contacts (not shown) are also connected with each of the top and bottom electrodes, and further structuring of the memory element is provided using any conventional and/or other suitable processing techniques as necessary to achieve the desired memory device (e.g., structuring of memory device 100 including phase change memory cells 104 having the same configuration as the memory element shown in FIG. 3).

Figure 6:
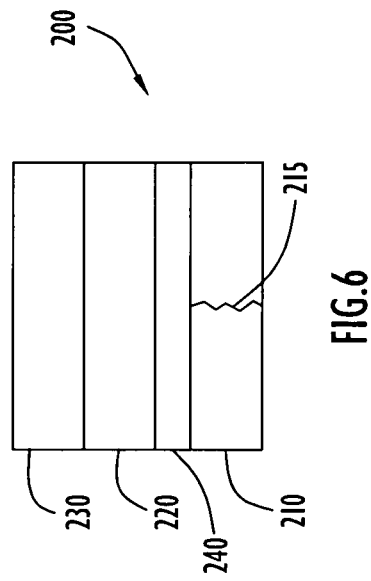
FIG. 6 is a schematic cross-sectional view of another embodiment of a phase change memory element including a diffusion barrier layer disposed between the bottom electrode layer and the phase change material layer.

When using a TMO material to form an electrode layer, an optional modification to the memory element of FIG. 3 is to provide a diffusion barrier layer between the electrode layer and the phase change material layer (e.g., diffusion barrier layer 240 as shown in FIG. 6). The diffusion barrier layer can be formed of any one or more suitable materials that prevent diffusion of metal ions from the TMO layer to the phase change material layer. Examples of materials that can be used for the diffusion barrier include TiN, TaN, Pt, Ir, IrO, Ru, TiSiN, TaSiN, TiAlN, TaAlN, C and WN. Suitable thicknesses of this diffusion barrier range from about 0.5 nm to about 10 nm.

Formation of a conductive contact or filament 215 through the insulating layer 210 of each memory element 200 in an array of memory elements (e.g., in a memory device as depicted in FIG. 1) can be achieved using suitable voltage, current and/or charge compliance to ensure uniform dimensions of the conductive filaments are achieved through the otherwise insulating layers of the memory elements in an array. Each memory element can be individually electrically processed (either prior to or after complete formation of the memory element) or electrically processed in groups of two or more memory elements to obtain the electrically conductive bottom electrode layers.

As noted above, a memory device 100 can be manufactured with a number of memory elements 200 integrated within the semiconductor chip, and where one of the bottom and top electrode layers 210, 230 of each memory element 200 is electrically coupled to a corresponding bit line 112 and the other of the bottom and top electrode layers 210, 230 of memory element 200 is electrically coupled to one side of the source-drain path of a corresponding select device 108.

It is important to achieve uniform conductive filament sizes within the bottom electrode layer 210 for each memory element in the array. In one example, each memory element or bit location on the semiconductor chip can be charged to the same or substantially similar capacitance by charging the bit lines to the same voltage and bit line capacitance values, and further ensuring current compliance in the memory elements using the drive transistor in the bit line write driver. The constant charge which is applied to each memory element ensures the formation of conductive filaments having substantially uniform dimensions within the bottom electrode layer of each memory element.

In another example, formation of conductive filaments having uniform dimensions in the insulating layers can be achieved using a multi-pulse process in which a series of voltage or current pulses are applied to an insulating layer of one or more memory elements, followed by measuring the resistance and/or other physical properties of each layer between each pulse to determine the nature and extent of filament formation within the layer. A feedback controlled algorithm can be designed to ensure each layer achieves substantially similar measured properties, thus ensuring the formation of conductive filaments with uniform dimensions through the electrode layers of the memory elements.

In another example in which amorphous carbon (e.g., DLC) is utilized as the insulating layer for forming an electrode layer for the memory element, the carbon layer can be irradiated with high energy ions (e.g., argon ions) so as to implant the ions within the carbon layer, which also results in the formation of nanometer-sized traces or conductive contacts extending through the otherwise insulating carbon layer.

In a further modification of the memory element as described above, the insulating layer with conductive contact or filament extending through the layer can be formed in the top electrode position and disposed above the phase change material layer rather than the bottom electrode position disposed below the phase change material layer. In other words, the embodiment of FIGS. 3-5 can be reversed, with electrode layer 230 being formed as a bottom electrode layer and electrode layer 210 (comprising the insulator material with conductive filament formed therein) being formed as a top electrode layer. The process for forming the self-assembled electrode layer can be easily modified so as to form the sublithographic contacts or filaments in insulating layers disposed at the top rather than the bottom of the memory element stack, since there is no requirement for etching or forming vias within the layers in order to form the conductive electrodes through the layers.

In another embodiment, both the top and bottom electrode layers can be formed with insulating material that has been electrically processed to form conductive contacts or filaments through the two insulating material layers.

Figure 5:
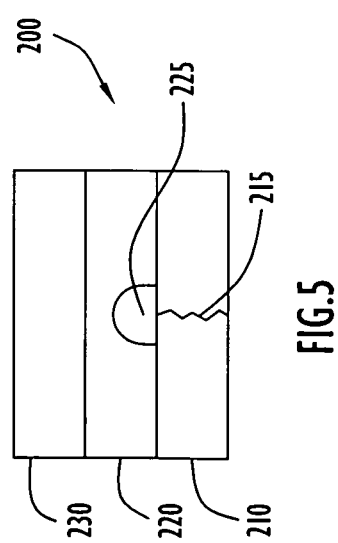
FIG. 5 is a schematic cross-sectional view of the phase change memory element of FIG. 4, in which a portion of the phase change material layer has been changed from amorphous to crystalline.

Operation of the memory element 200 is described with reference to FIGS. 1, 4 and 5, where it is understood that each phase change memory element 106 corresponds with memory element 200. The phase change material layer 220 depicted in FIG. 4 is in an amorphous state. During a "set" operation of phase change memory cell 104, a set current or voltage pulse is selectively enabled by write circuit 124 and sent through the corresponding bit line 112 to phase change memory element 200, so as to heat phase change material layer 220 above its crystallization temperature, where it achieves some level of crystallinity (indicated by crystallized section 225 depicted in FIG. 5) and changes the resistance level of the phase change material.

During a "reset" operation of phase change memory cell 104, a reset current or voltage pulse is selectively enabled by write circuit 124 and sent through corresponding bit line 112 to phase change memory element 200. The reset current or voltage quickly heats phase change material layer 220 above its melting temperature, and afterward the layer 200 is quenched cooled to an amorphous state (which also changes the resistance of the layer) as shown in FIG. 4. During the "set" and "reset" operations, the electrically conductive contact or filament 215 within electrode layer 210 remains stable to facilitate heating of the phase change memory layer to its different resistive states.

While the specific embodiments described herein focus primarily upon using phase change memory elements in a memory device, the present invention can be applied to any suitable type of resistance changing memory elements (e.g., magnetoresistive elements in MRAM devices).

In addition, since the formation of the self-assembled sublithographic electrically conductive contact or filament in the insulating layer described above is reversible and the insulating layer can be switched to different resistive states upon application of suitable voltages and currents to the layer, it is possible to utilize the insulating layer itself as a resistance changing memory element. However, as noted above, the current density required to sufficiently dissipate or destroy the conductive contact or filament within the insulating layer (thus increasing the resistive state of the insulating layer) is much greater than the current density required to switch other forms of resistance changing memory elements. Therefore, it is preferable that the insulating layer with conductive filament be used as an electrode or conductive heater for memory devices.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed:

1. An integrated circuit comprising a memory cell including a resistance changing memory element, the resistance changing memory element comprising:
    a first electrode comprising an insulator material configured to reversibly change resistive states with the first electrode having a first resistance value and including a self-assembled electrically conductive element formed within the insulator material in response to application of a set current to the first electrode and the first electrode having a second resistance value that is greater than the first resistance value in response to application of a reset current to the first electrode;
    a second electrode; and
    a resistivity changing material disposed between the first and second electrodes, wherein the resistivity changing material is configured to change resistive states in response to application of a voltage or current to the first and second electrodes;
    wherein the resistance changing memory element is configured such that, during operation, the resistivity changing material changes resistive states while the first electrode maintains the first resistance value including the self-assembled electrically conductive element formed within the insulator material.

2. The integrated circuit of claim 1, wherein the reset current is greater than the set current.

3. The integrated circuit of claim 2, wherein the reset current required to change the insulator material to the second resistance value is greater than a maximum current required to change the resistive state of the resistivity changing material.

4. The integrated circuit of claim 1, wherein the electrically conductive element comprises an elongated filament having a cross-sectional dimension extending in a direction transverse a length of the filament and that is no greater than about 20 nm.

5. The integrated circuit of claim 4, wherein the insulator material of the first electrode has a thickness no greater than about 20 nm.

6. The integrated circuit of claim 1, wherein the resistivity changing material comprises a phase change material including at least one of Ge, Sb, Bi, Te, Ga, Ag, In, Se, and S.

7. The integrated circuit of claim 6, wherein the phase change material includes Ge, Sb and Te.

8. The integrated circuit of claim 6, wherein the insulator material comprises an amorphous carbon material.

9. The integrated circuit of claim 6, wherein the insulator material comprises diamond-like carbon.

10. The integrated circuit of claim 6, wherein the insulator material comprises a transition metal oxide including a metal selected from the group consisting of nickel, titanium, strontium, hafnium and zirconium.

11. The integrated circuit of claim 1, wherein the first electrode is formed as a single layer within the resistance changing memory element.

12. The integrated circuit of claim 1, wherein the electrically conductive element is formed from one or more elements disposed within the insulator material prior to application of any electrical current to the first electrode.

13. An integrated circuit comprising a memory cell including a resistance changing memory element, the resistance changing memory element comprising:
    a first electrode comprising a material that is configured to reversibly change in response to application of different electrical currents from a first resistive state in which the material operates as an insulator to a second resistive state that is less than the first resistive state, the material being electrically conductive at the second resistive state;

a second electrode; and a resistivity changing material disposed between the first and second electrodes, wherein the resistivity changing material is configured to change resistive states in response to application of a voltage or current to the first and second electrodes;

wherein the resistance changing memory element is configured such that, during operation, the resistivity changing material changes resistive states while the material of the first electrode maintains the second resistive state.

14. The integrated circuit of claim 13, wherein the first electrode is formed as a single layer within the resistance changing memory element.

15. The integrated circuit of claim 13, wherein the material of the first electrode comprises at least one of an amorphous carbon material, diamond-like carbon, and a transition metal oxide including a metal selected from the group consisting of nickel, titanium, strontium, hafnium and zirconium.

16. The integrated circuit of claim 13, wherein the material of the first electrode becomes electrically conductive at the second resistive state from one or more elements disposed within the material of the first electrode prior to application of any electrical current to the first electrode.

17. A memory device comprising a plurality of memory cells, at least one memory cell including a resistance changing memory element, the resistance changing memory element comprising:

a first electrode comprising a material that is configured to reversibly change in response to application of different electrical currents from a first resistive state in which the material operates as an insulator to a second resistive state that is less than the first resistive state, the material being electrically conductive at the second resistive state;

a second electrode; and a resistivity changing material disposed between the first and second electrodes, wherein the resistivity changing material is configured to change resistive states in response to application of a voltage or current to the first and second electrodes;

wherein the resistance changing memory element is configured such that, during operation, the resistivity changing material changes resistive states while the material of the first electrode maintains the second resistive state.

18. The memory device of claim 17, wherein the first electrode is formed as a single layer within the resistance changing memory element.

19. The memory device of claim 17, wherein the material of the first electrode comprises at least one of an amorphous carbon material, diamond-like carbon, and a transition metal oxide including a metal selected from the group consisting of nickel, titanium, strontium, hafnium and zirconium.

20. The memory device of claim 17, wherein the material of the first electrode becomes electrically conductive at the second resistive state from one or more elements disposed within the material of the first electrode prior to application of any electrical current to the first electrode.

* * * * *